(12) United States Patent
Ranta et al.

(10) Patent No.: US 7,187,945 B2
(45) Date of Patent: Mar. 6, 2007

(54) VERSATILE ANTENNA SWITCH ARCHITECTURE

(75) Inventors: Tero Ranta, Turku (FI); Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 124 days.

(21) Appl. No.: 10/836,124

(22) Filed: Apr. 30, 2004

(65) Prior Publication Data

US 2005/0245202 A1 Nov. 3, 2005

(51) Int. Cl.
*H04M 1/00* (2006.01)

(52) U.S. Cl. ...................... 455/552.1; 455/78
(58) Field of Classification Search ............. 455/432.2, 455/432.3, 435.2, 435.3, 552.1, 553.1
See application file for complete search history.

(56) References Cited

U.S. PATENT DOCUMENTS

| | | | | |
|---|---|---|---|---|
| 5,507,010 A * | 4/1996 | Ahonen | ................... | 455/67.14 |
| 6,014,551 A | 1/2000 | Pesola et al. | ................. | 455/86 |
| 6,188,718 B1 * | 2/2001 | Gitlin et al. | ................ | 375/148 |
| 6,351,502 B1 * | 2/2002 | Zargari | ....................... | 375/324 |
| 6,381,471 B1 * | 4/2002 | Dvorkin | .................. | 455/552.1 |
| 6,389,269 B1 * | 5/2002 | Nanni et al. | .................. | 455/93 |
| 6,560,443 B1 * | 5/2003 | Vaisanen et al. | .............. | 455/73 |
| 6,766,149 B1 * | 7/2004 | Hikita et al. | .................. | 455/83 |
| 6,865,376 B2 * | 3/2005 | Forrester | ...................... | 455/73 |
| 6,957,081 B2 * | 10/2005 | Leyh et al. | .............. | 455/553.1 |
| 6,990,357 B2 * | 1/2006 | Ella et al. | ................ | 455/553.1 |
| 2004/0162107 A1 * | 8/2004 | Klemetti et al. | ......... | 455/553.1 |

* cited by examiner

*Primary Examiner*—Lester G. Kincaid
*Assistant Examiner*—Gary Au
(74) *Attorney, Agent, or Firm*—Ware, Fressola, Van Der Sluys & Adolphson LLP

(57) ABSTRACT

A RF front-end having two antenna switches operatively connected to two separate antennas. The antenna switches can be used to route various transmit and receive paths to the antennas. In particular, one of the antenna switches has three switch position for use in selectively routing the 2 GHz receive paths, and another antenna switch has six switch positions for use in selectively routing the 2 GHz transmit paths and the 1 GHz signal paths. With the disclosed topology, the front-end can be used to support GSM and W-CDMA communications in many regional variants in the world. The supported variants include US1, US2, EU1, EU2 and EU/US modes. The same front-end can also be used in BT/WLAN connectivity. For MIMO purposes, one more antenna switch for the 2 GHz receive paths can be added to the same RF front-end.

43 Claims, 11 Drawing Sheets

(c)

VERSATILE ANTENNA SWITCH ARCHITECTURE

CROSS REFERENCE TO RELATED APPLICATIONS

The present application is related to U.S. patent application Ser. Nos. 10/688,181, 10/688,275 and 10/688,807, all filed on Oct. 17, 2003, and assigned to the assignee of the present application. The present application is also related to U.S. patent application Ser. No. 10/836,123, assigned to the assignee of the present application, and filed even date herewith.

FIELD OF THE INVENTION

The present invention generally relates to an RF front-end module and, more specifically, to an RF front-end for use in GSM and WCDMA communications.

BACKGROUND OF THE INVENTION

In an electronic device for use in GSM and WCDMA communications, the multimode engine has a duplexer to feed WCDMA transmit and receive paths to a WCDMA antenna, and a dedicated GSM antenna/switch module is used for the GSM modes, as shown in FIG. 1. In this dual antenna topology, no antenna switching is required between GSM and WCDMA modes. As shown, the GSM antenna switch is used for selection between four GSM receive paths and two GSM transmit paths. The duplexer only handles one WCDMA receive path and one WCDMA transmit path.

If more than one WCDMA or CDMA band is required in addition to the quad-band GSM bands, the complexity of the RF front-end increases significantly. For example, when the same antenna is used to support two CDMA bands (850 and 1900), a diplexer filter is used, along with two duplexers, to route the transmit paths and receive paths to the CDMA antenna, as shown in FIG. 2. As shown in FIG. 2, no switching is used for the CDMA bands. The use of a diplexer or passive matching of filters is generally feasible only when the frequency separation between the duplexers is sufficiently large, such as the frequency separation of 1 GHz. For example, it is not feasible to use a diplexer approach to combine a 1900 duplexer and a 2100 duplexer for EU/US WCDMA operations. Furthermore, if the bands overlap in frequency (e.g. 1800 and 1900 bands), the diplexer approach is equally impossible. In those cases, switching is currently the only option.

Due to the large number of different bands and the number of combinations thereof in different systems used around the world, using traditional methods and topologies for band selection and mode switching is difficult. Currently, there are many regional variants in the band combinations that may be implemented for different regions in the world. Some of these variants are listed below:

US1: 4xGSM (850, 900, 1800, 1900) & 2xUS-WCDMA (850, 1900)

US2: 4xGSM (850, 900, 1800, 1900) & 2xUS-WCDMA (1700/2100, 1900)

EU1: 4xGSM (850, 900, 1800, 1900) & EU-WCDMA (2100)

EU2: 4xGSM (850, 900, 1800, 1900) & EU-WCDMA (1800, 2100)

EU/US: 4xGSM (850, 900, 1800, 1900) & EU-WCDMA (2100) & US-WCDMA (1900)

It would be difficult to implement all these different variants efficiently if the GSM and WCDMA modes are handled separately and no switching is used for WCDMA.

It should be noted that the 850 frequency band and the 1900 frequency band can be used in any one of GSM, WCDMA and CDMA standards. For example, the 850 GSM in the US2, EU1, EU2 and EU/US variants can also be used for CDMA or WCDMA instead. Likewise, the 1900 GSM in the EU1, EU2 variants can also be used for CDMA or WCDMA.

The nomenclature of the bands and the respective Rx/Tx frequencies are listed in Table I.

TABLE I

| Continent | Name | TX freq | RX freq |
| --- | --- | --- | --- |
| US | GSM 850 | 824–849 | 869–894 |
| EU | GSM 900 | 880–915 | 925–960 |
| EU | GSM 1800 | 1710–1785 | 1805–1880 |
| US | GSM 1900 | 1850–1910 | 1930–1990 |
| US | WCDMA or CDMA 850 | 824–849 | 869–894 |
| US | WCDMA or CDMA 1900 | 1850–1910 | 1930–1990 |
| US | WCDMA 1700/2100 | 1710–1755 | 2110–2155 |
| EU | WCDMA 1800 | 1710–1785 | 1805–1880 |
| EU | WCDMA 2100 | 1920–1980 | 2110–2170 |

It is thus advantageous and desirable to provide a method to optimize the mobile phone engine variants and front-end architecture.

SUMMARY OF THE INVENTION

The present invention uses two antenna switches to route various transmit and receive paths to two separate antennas. In particular, one of the antenna switches is used to route the 2 GHz receive paths, and another antenna switch is used for switching among the 2 GHz transmit paths and the 1 GHz signal paths.

Thus, the first aspect of the present invention provides a method for routing a plurality of RF communications signal paths in a communications device having at least a first antenna and a second antenna, wherein the signal paths comprises a plurality of receive paths and transmit paths for conveying signals in a plurality of operating modes in a first frequency range substantially between 800 MHz and 990 MHz, and a second frequency range substantially between 1600 MHz and 2500 MHz. The method comprises:

providing a first signal path selecting part operatively connected to the first antenna;

providing a second signal path selecting part operatively connected to the second antenna;

operatively connecting the plurality of receive paths to the second signal path selecting part for selectively conveying receive signals in the second frequency range via the second antenna; and operatively connecting the plurality of transmit and receive paths to the first signal selecting part for selectively conveying signals in the first frequency range via the first antenna.

According the present invention, the method further comprises:

operatively connecting the plurality of further transmit paths to the first signal selecting part for selectively conveying signals in the second frequency range via the first antenna.

According to the present invention, the communications device further comprising a third antenna and the method further comprises:

providing a third path selecting part operatively connected to the third antenna; and operatively connecting a plurality of further transmit paths to the third signal selecting part for selectively conveying signals in the second frequency range via the third antenna.

According to the present invention, the first signal path selecting part comprises a plurality of switches for selecting the transmit and receive paths in the first frequency range.

According to the present invention, the first signal path selecting part comprises a plurality of switches for selecting the transmit and receive paths in the first frequency range and the transmit paths in the second frequency range.

According to the present invention, the first and third signal path selecting parts comprise a plurality of switches for selecting the transmit and receive paths in the first frequency range and the transmit path in the second frequency range.

According to the present invention, the second signal path selecting part comprises a plurality of switches for selecting the receive paths in the second frequency range.

According to the present invention, the second signal path selecting part comprises at least a balun and a matching mechanism for selecting the receive paths in the second frequency range.

According to the present invention, the receive paths comprise a plurality of baluns and a plurality of passband filters connected to the baluns in series, and the second signal path selecting part comprises at least one matching mechanism operatively connected to the baluns for selecting the receive paths in the second frequency range.

According to the present invention, the second signal path selecting part comprises a plurality of phase-shifting elements for selecting the receive paths in the second frequency range.

According to the present invention, the communications device further comprises a third antenna and the method further comprises:

providing a third signal path selecting part operatively connected to the third antenna;

operatively connecting a plurality of further receive paths to the third signal path selecting part for conveying receive signals in the second frequency range via the third antenna.

The second aspect of the present invention provides a signal path selection part for use in a communications device, the communications device having at least a first antenna and a second antenna for conveying signals in a plurality of operating modes in a first frequency range substantially between 800 MHz and 990 MHz and a second frequency range substantially between 1600 MHz and 2500 MHz via a plurality of transmit and receive paths. The signal path selection part comprises:

a first signal path selecting sub-part operatively connected to the first antenna; and a second signal path selecting sub-part operatively connected to the second antenna, wherein the second signal path selecting sub-part comprises a plurality of selectable positions for operatively connecting a plurality of receive paths for selectively conveying receive signals in the second frequency range via the second antenna, and the first signal path selecting sub-part comprises a plurality of selectable positions for operatively connecting a plurality of transmit and receive paths for selectively conveying transmit signals in the first and second frequency ranges and receive signals in the first frequency range via the first antenna.

According to the present invention, the first signal path selecting sub-part comprises a plurality of switches for selecting the transmit and receive paths in the first frequency range and the transmit paths in the second frequency range.

According to the present invention, the second signal path selecting sub-part comprises a plurality of switches for selecting the receive paths in the second frequency range.

According to the present invention, the second signal path selecting sub-part comprises at least a balun and a matching mechanism for selecting the receive paths in the second frequency range.

According to the present invention, the receive paths comprise a plurality of baluns and a plurality of passband filters connected to the baluns in series, and the second signal path selecting sub-part comprises at least one matching mechanism operatively connected to the baluns for selecting the receive paths in the second frequency range.

According to the present invention, the second signal path selecting sub-part comprises a plurality of phase-shifting elements for selecting the receive paths in the second frequency range.

According to the present invention, the communication device further comprises a third antenna. The part further comprising:

a third signal path selecting sub-part operatively connected to the third antenna, wherein the third signal path selecting sub-part comprises a plurality of selectable positions for operatively connecting a plurality of further receive paths for selectively conveying receive signals in the second frequency range via the third antenna.

The third aspect of the present invention provides a communications device operable in a plurality of operating modes in a first frequency range substantially between 800 MHz and 990 MHz and a second frequency range substantially between 1600 MHz and 2500 MHz. The communications device comprising:

a first antenna;
a second antenna; and
a front-end part comprising:
  a first signal path selecting sub-part operatively connected to the first antenna; and
  a second signal path selecting sub-part operatively connected to the second antenna, wherein
  the second signal path selecting sub-part comprises a plurality of selectable positions for operatively connecting a plurality of receive paths for selectively conveying receive signals in the second frequency range via the second antenna, and
  the first signal path selecting sub-part comprises a plurality of selectable positions for operatively connecting a plurality of transmit and receive paths for selectively conveying transmit signals in the first and second frequency ranges and receive signals in the first frequency range via the first antenna.

According to the present invention, the communications device comprises the transmit and receive paths for transmitting or receiving signals for use in US1 standard, including 850GSM, 900GSM, 1800GSM, 1900GSM, and 850 code-division multiple access.

According to the present invention, the communications device comprises the transmit paths and receive paths for transmitting or receiving signals for use in US2 standard, including 850GSM, 900GSM, 1800GSM, 1900GSM, and 1700/2100 and 1900 code-division multiple access.

According to the present invention, the communications device comprises the transmit paths and receive paths for transmitting or receiving signals for use in EU1 standard, including 850GSM, 900GSM, 1800GSM, 1900GSM, and 2100 code-division multiple access.

According to the present invention, the communications device comprises the transmit paths and receive paths for transmitting or receiving signals for use in EU2 standard, including 850GSM, 900GSM, 1800GSM, 1900GSM, and 1800 and 2100 code-division multiple access.

According to the present invention, the communications device comprises the transmit paths and receive paths for transmitting or receiving signals for use in EU/US standard, including 850GSM, 900GSM, 1800GSM, 1900GSM, and 1900 and 2100 code-division multiple access.

According to the present invention, the communications device further comprises a third antenna, and the front-end part further comprises:

a third signal path selecting sub-part operatively connected to the third antenna, the third signal path selecting sub-part comprising a plurality of selectable positions for operatively connecting a plurality of further receive paths for selectively conveying receive signals in the second frequency range via the third antenna.

The communications device can be a mobile terminal or the like.

According to the present invention, at least one of said plurality of receive paths for receiving signals in the second frequency range via the second antenna is used for receiving signals in a frequency range substantially between 2.4–2.5 GHz.

According to the present invention, the communication device further comprises a transmit path for transmitting signals in a frequency range substantially between 2.4–2.5 GHz via the second antenna and a sub-switch for selecting between said transmit path and said at least one receive path for receiving signals in the 2.4–2.5 GHz. The transmit and receive signals in the 2.4–2.5 GHz frequency range are Bluetooth or WLAN signals.

The fourth aspect of the present invention provides an RF-front-end part for use in a communications device operable in a plurality of operating modes in a first frequency range substantially between 800 MHz and 990 MHz and a second frequency range substantially between 1600 MHz and 2500 MHz, the communications devices comprising a first antenna and a second antenna. The front-end part comprises:

a first signal path selecting sub-part operatively connected to the first antenna;

a second signal path selecting sub-part operatively connected to the second antenna;

a plurality of receive paths operatively connected to the second signal path selecting sub-part for selectively conveying signals in the second frequency range through a plurality of filters operable in the second frequency range;

a plurality of transmit paths operatively connected to the first signal path selecting sub-part for selectively conveying signals in the second frequency range through a plurality of filter operable in the second frequency range; and a plurality of transmit and receive paths operatively connected to the first signal path selecting sub-part for selectively conveying signals in the first frequency range through a plurality of filters operable in the first frequency range.

According to the present invention, the transmit and receive paths are used for transmitting and receiving signals in various standards including: US1, US2, EU1, EU2, EU/US and Bluetooth/WLAN.

According to the present invention, the communications device further comprises a third antenna, and the front-end part further comprises:

a third signal path selecting sub-part operatively connected to the third antenna, the third signal path selecting sub-part comprising a plurality of selectable positions for operatively connecting a plurality of further receive paths for selectively conveying receive signals in the second frequency range via the third antenna.

The present invention will become apparent upon reading the description taken in conjunction with FIG. 3 to 11.

BRIEF DESCRIPTION OF THE INVENTION

DETAILED DESCRIPTION OF THE INVENTION

The present invention uses two antenna switches to route various transmit and receive paths to two separate antennas. In particular, one of the antenna switches is used to route the 2 GHz receive paths, and another antenna switch is used for switching among the 2 GHz transmit paths and the 1 GHz signal paths. As shown in FIGS. 3 to 7, SW2 is the antenna switch module for 2 GHz receive paths and comprises three switch positions (SP3T) separately labeled as Ra, Rb and Rc. As such, up to three receive paths can be connected to SW2. The other antenna switch module, or SW1, comprises six switch positions (SP6T) separately labeled as R1, R2, T1, T2, W1, W2. As such, up to six signal paths can be connected to SW1. In the illustrative examples in FIGS. 3 to 7, the switch positions W1 and W2 are two full-duplex branches for routing WCDMA/CDMA signal paths; the switch positions R1 and R2 are used for routing 1 GHz receive paths; the switch position T1 is used for routing the 1 GHz transmit path; and the switch position T2 is used for routing the 2 GHz transmit path. The switch positions can be used differently to meet the specific need in RF communications. However, because very high linearity is required for WCDMA/CDMA switching, it is generally not possible or practical to use GSM TX branches for WCDMA switching. Thus, it is desirable to have two dedicated WCDMA/CDMA branches with high linearity switches in SW1.

Figure 9:
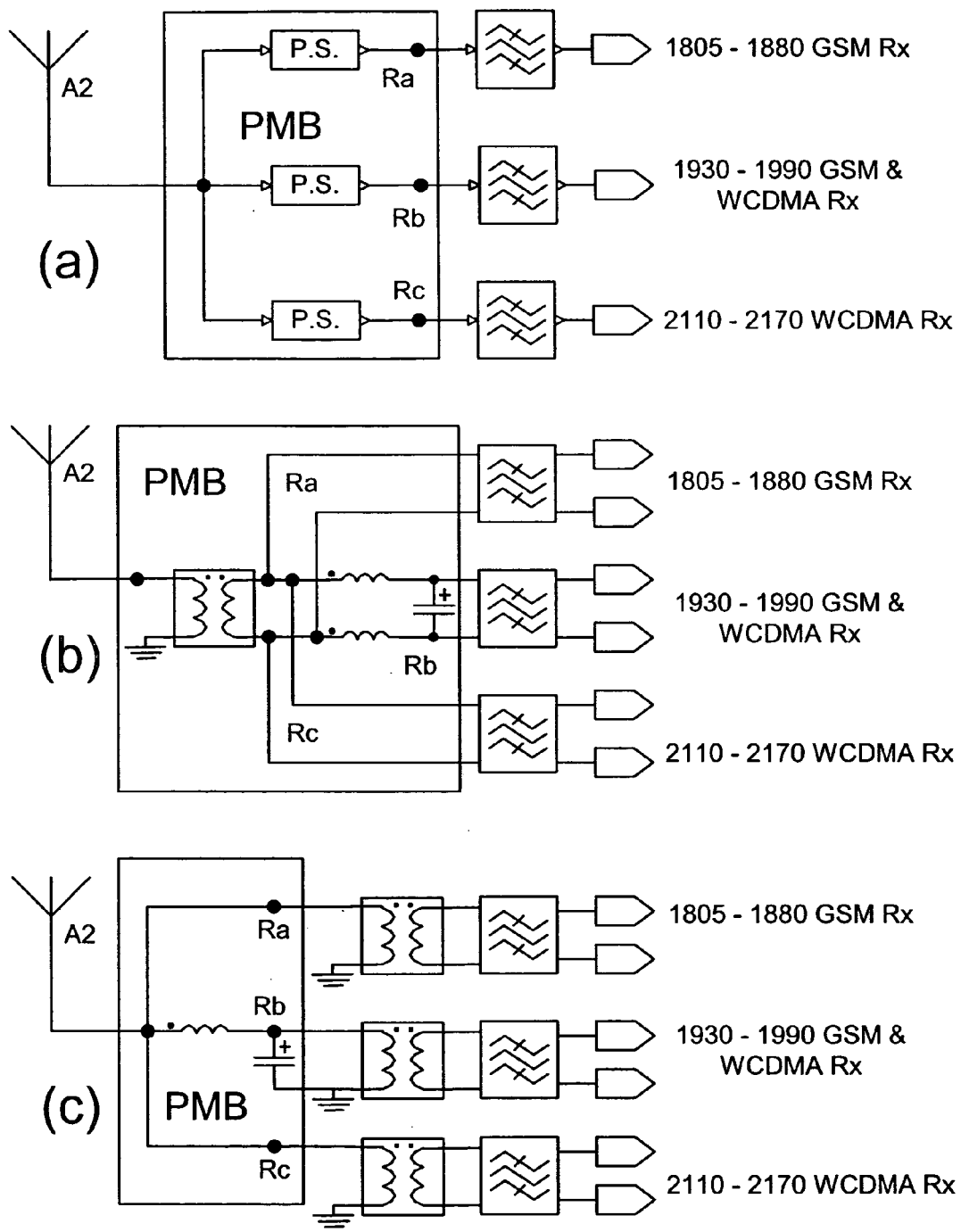
FIG. 9 is a block diagram showing three embodiments of a passive matching box, which is used to replace a 2 GHz antenna switch module.

It is possible to replace the SW2 module with a passive matching block, as shown in FIG. 9. If passive matching is used, the cross-band isolation (TX signal leakage from the PA (power amplifier) back to the RFIC through the pass-bands of the RX filters when the TX and RX frequencies overlap (for example, 1900 TX and 1800 RX) is potentially a problem. The use of a switch provides sufficient isolation for the inactive RX filters to effectively overcome this problem. In addition, the switch is typically physically smaller than the passive components required for matching the three filters. For these reasons switching is preferred over passive matching. The power compression requirements for the SW2 module are lower than that for SW1 as it handles only low RX power levels. Nevertheless it must still have good linearity properties for WCDMA RX due to the WCDMA TX signal leakage through the antenna to the antenna port of the second antenna switch.

The antenna switch SW1 is operatively connected to antenna A1, which is used to transmit and receive signals in 1 GHz and 2 GHz frequency bands. The antenna switch SW2 is operatively connected to antenna A2 for receiving 2 GHz signals only. Because switching is used in SW1, frequency overlapping among the connected signal paths is allowed. For example, it is possible to route the 850 US-WCDMA receive path (869 MHz–894 MHz) and the 900 GMS transmit path (880 MHz–915 MHz) to the same antenna. Likewise, it is also possible to route the 1900 US-WCDMA transmit path (1850 MHz–1910 MHz) and the 1800 GSM transmit path (1710 MHz–1785 MHz) to the same antenna even though the frequency separation between these two signal paths is less than 1 GHz. Similarly, because switching is also used in SW2, it is possible to route three different 2 GHz receive paths to the same antenna. It should be noted that none of the illustrated band combinations have overlapping frequencies. Thus, it is possible to use a passive matching block to replace SW2.

In order to demonstrate the universality of the antenna switch arrangement (SW1, SW2) of the present invention, the routing of signal paths for different regional variants is shown in FIGS. 3 to 7. The present invention utilizes the fact that many of the US and EU standards have same frequencies. Thus, reusing certain band pass filters is possible. By proper switching, the number of needed filters is less than the number of standards that can be supported. By using the antenna switch architecture, according to the present invention, a very portable and universal front-end can be designed for different regions in the EU and US, and potentially for other parts of the world. The antenna switch architecture, according to the present invention, can be ported to at least five different regional designs as shown in FIGS. 3 to 7, with only slight modifications to the selected set of filters and/or duplexers.

The five different regional variants are described in more detail below.

I. US1

The US1 version, as shown in FIGS. 3a and 3b, supports quad-band GSM (850, 900, 1800, 1900) and two US-WCDMA bands (850 and 1900). The 900 GSM RX, 850/900 GSM TX, 1800/1900 GSM TX, 850 WCDMA duplexer and the 1900 WCDMA TX filters are connected to the main antenna A1, via the GSM/WCDMA antenna switch module SW1. In FIG. 3a, the R1 position is not used. The 850 GSM RX is routed through the W1 position via the 850 WCDMA duplexer. As such, the RX filter of the duplexer is used for both the 850 GSM RX and 869–894 WCDMA RX.

It is possible to use a dedicated filter to connect the 850 GSM RX to antenna A1 through the R1 position of SW1, as shown in FIG. 3c, instead of routing the 850 GSM RX through the 850 WCDMA duplexer. As such, the RX filter of the duplexer connected to W1 is used only for 869–894 WCDMA RX. This can be useful to lower the losses for the 850 GSM RX mode, as the duplexer has higher loss compared to a single filter due to the duplexing loss.

The 1800 GSM RX and 1900 GSM/WCDMA RX filters are connected to the second antenna A2 through the second antenna switch module SW2, as shown in FIG. 3b (or passive matching). It should be noted that the 1900 GSM RX and 1900 WCDMA RX paths use the same band-pass filter. Alternatively, the 1900 WCDMA TX filter on A1 may be replaced by a 1900 WCDMA duplexer, which leaves the 1900 RX filter on A2 only for GSM use.

II. US2

The US2 version, as shown in FIGS. 4a and 4b, supports quad-band GSM (850, 900, 1800, 1900) and two US-WCDMA bands (1700/2100 and 1900). The 850 GSM RX, 900 GSM RX, 850/900 GSM TX, 1800/1900 GSM TX, 1700 WCDMA TX and 1900 WCDMA TX filters are connected to the main antenna A1 via the GSM/WCDMA antenna switch module SW1, as shown in FIG. 4a. The 1800 GSM RX, 1900 GSM/WCDMA RX and 1700 WCDMA RX filters are connected to the second antenna A2 through the antenna switch module SW2 as shown in FIG. 4b (or passive matching). It should be noted that the 1900 GSM RX and 1900 WCDMA RX paths use the same band-pass filter. Alternatively, the 1700 and/or 1900 WCDMA TX filter on A1 may be replaced by a 1700 and/or 1900 WCDMA duplexer, which leaves the 1900 RX filter on A2 only for GSM use.

III. EU1

The EU1 version, as depicted in FIGS. 5a and 5b, supports quad-band GSM (850, 900, 1800, 1900) and EU-WCDMA band (2100). The 850 GSM RX, 900 GSM RX, 850/900 GSM TX, 1800/1900 GSM TX, and the 2100 WCDMA TX are connected to the main antenna A1 via the proposed GSM/WCDMA antenna switch module SW1 as shown in FIG. 5a. The 1800 GSM RX, 1900 GSM RX and 2100 WCDMA RX filters are connected to the second antenna A2 through the second antenna switch module SW2 as shown in FIG. 5b (or passive matching). Alternatively, the 2100 WCDMA TX filter on A1 may be replaced by a 2100 WCDMA duplexer.

IV. EU2

The EU2 version, as shown in FIGS. 6a and 6b, supports quad-band GSM (850, 900, 1800, 1900) and two EU-WCDMA bands (1800 and 2100). The 850 GSM RX, 900 GSM RX, 850/900 GSM TX, 1800/1900 GSM TX, 1800 WCDMA TX and 2100 WCDMA TX filters are connected to the main antenna A1 via the GSM/WCDMA antenna switch module SW1 as shown in FIG. 6a. The 1800 GSM/WCDMA RX, 1900 GSM RX and 2100 WCDMA RX filters are connected to the second antenna A2 through the second antenna switch module SW2 as shown in FIG. 6b (or passive matching). It should be noted that the 1800 GSM RX and 1800 WCDMA RX paths use the same band-pass filter. Alternatively, the 1800 and/or 2100 WCDMA TX filter on A1 may be replaced by a 1800 and/or 2100 WCDMA duplexer, which leaves the 1800 RX filter on A2 only for GSM use.

V. EU/US

The EU/US version, as shown in FIGS. 7*a* and 7*b*, supports quad-band GSM (850, 900, 1800, 1900), EU-WCDMA (2100) and US-WCDMA (1900). The 850 GSM RX, 900 GSM RX, 850/900 GSM TX, 1800/1900 GSM TX, 1900 WCDMA TX and 2100 WCDMA TX filters are connected to the main antenna A1 via the GSM/WCDMA antenna switch module SW1 as shown in FIG. 7*a*. The 1800 GSM RX, 1900 GSM/WCDMA RX and 2100 WCDMA RX filters are connected to the second antenna A2 through the second antenna switch module SW2 as shown in FIG. 7*b* (or passive matching). It should be noted that the 1900 GSM RX and 1900 WCDMA RX paths use the same band-pass filter. Alternatively, the 1900 and/or 2100 WCDMA TX filter on A1 may be replaced by a 1900 and/or 2100 WCDMA duplexer, which leaves the 1900 RX filter on A2 only for GSM use.

It should also be noted that if multi-band GSM and 2xUS-WCDMA (850, 1900) operation is required and WCDMA switching is not available and there is only one antenna for the 1 GHz bands, the 850 WCDMA duplexer must be connected to the 1 GHz antenna. Thus the 850 GSM TX must be driven through the TX branch of the 850 WCDMA duplexer, which has higher losses (typically greater than 2.5 dB) compared to a dedicated 850 GSM TX harmonic filter (typically smaller than 1 dB). Switching is also required in this case to select between the 850 GSM PA and 850 WCDMA PA, as the PAs for GSM and WCDMA are typically separate. This further increases the losses for the 850 GSM TX path (typically 3 dB). The increased losses for GSM TX have serious consequences for the power consumption and heating of the mobile terminal at high power levels. This topology (only one 1 GHz antenna and 850 duplexer) also makes it impossible to implement the 900 GSM band (severe limitation for use in Europe outside city areas), so only triple-band GSM operation is possible. Note also that it is not generally practical to use two antennas both capable for 1 GHz and 2 GHz operation on the same phone, as the 1 GHz portion of the antenna is physically bulky. The present invention (specially FIG. 3) has solved substantially the above discussed problems and is superior to the prior art in most performance parameters.

The embodiments shown in FIGS. 3 to 7 are mainly for EU and US GSM and W-CDMA standards but the same invention may be expanded to other regions, band combinations or non-cellular applications as well. All of the figures show single-ended to single-ended filters and duplexers, but the filters may have single-ended input and differential output (single-to-balanced) or fully differential input and output (fully balanced) and a balun may be used to perform the mode conversion. The switches referred to in this disclosure can be of any type, i.e. CMOS, GaAs, MEMS or even PIN diodes.

Similarly, the band-pass filters may be SAW (surface acoustic wave devices, either single-to-balanced or fully balanced), or they can be BAWs (balk acoustic wave devices, either fully balanced or filters that incorporate an acoustic balun). The baluns can be integrated or discrete magnetic baluns, transmission line based baluns or even L/C baluns. The duplexers are typically ceramic, or composed of SAW and/or BAW filters. The harmonic filters dedicated for GSM TX are typically LC filters, but in some cases GSM TX signals may be routed through the TX branch of a WDMA/CDMA duplexer at the expense of higher insertion loss.

Figure 8:
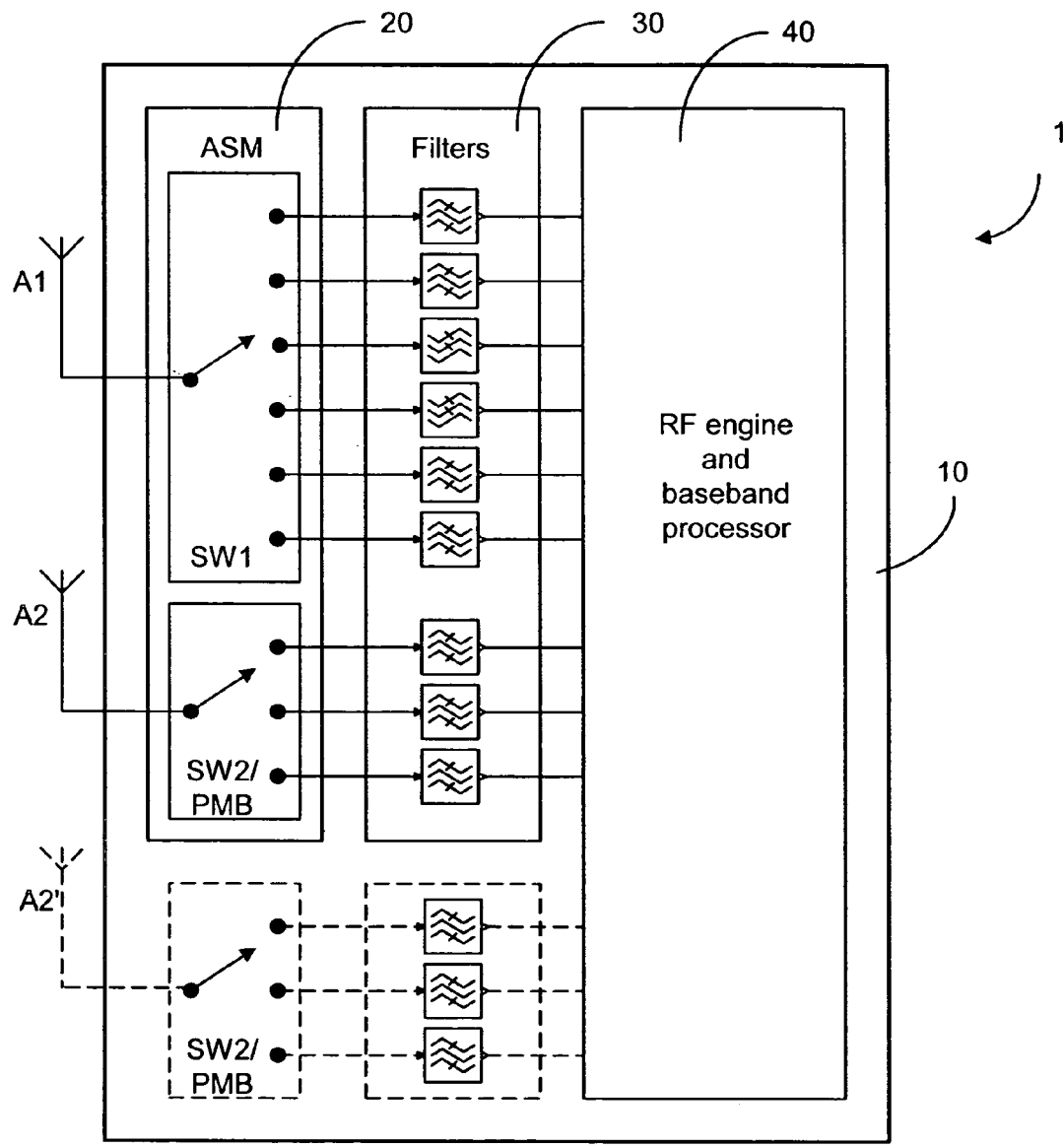
FIG. 8 is a block diagram showing a communication device having a GSM/WCDMA RF front-end module, according to the present invention.

The antenna switch modules SW1 and SW2 can be used in a multiband, multimode mobile cellular handset that has two separate antennas. The antenna switch modules are used to provide signal connections between an RF front end and the antennas. The term front-end is used to refer to the RF electronics (filtering, switching, etc.) between the antennas and the power amplifiers (PAs) or RFIC. FIG. 8 is a schematic representation illustrating a communications device, such as a mobile terminal 1, having a housing to dispose at least two antennas A1 and A2. The communications device 1 comprises an antenna switch module 20, which can be divided into a sub-module SW1 and a sub-module SW2, separately connected to A1 and A2. The sub-module SW2 can be replaced by a passive matching block (PMB) as shown in FIG. 8. The communications device 1 further comprises a plurality of filters 30 disposed between the antenna switch module and an RF engine 40 (including PAs, or RFIC and baseband processor).

It should be noted that any of the embodiments of FIGS. 3 to 7 can support MIMO (Multiple Input Multiple Output) by only having a duplicate 2 GHz antenna A2', an additional SW2' (or PMB) and more 2 GHz filters, as shown in FIGS. 9*a*–9*c*.

As mentioned above, because the illustrated band combinations does not have overlapping frequencies in SW2, it is possible to use passive matching instead of switching. FIGS. 9*a* to 9*b* illustrate three versions of passive matching. In FIG. 9*a*, the passive matching block comprises a plurality of delays or phase shifters are disposed between the filters and the antenna A2. The delays can be implemented with transmission lines, such as microstrips, or with lumped elements. In FIG. 9*b*, the passive matching block comprises a phase shifter having inductive and conductive elements and a balun. In FIG. 9*c*, the passive matching block comprises three baluns disposed between the antenna A2 and the filters, and a phase shifter disposed at the common node for passive matching.

The present invention utilizes the splitting of the RX and TX branches of the duplexers to different antennas. This improves the insertion loss of the filters (no duplexing loss) and the RX-TX isolation (RX-TX isolation improves by the amount of isolation between the two antennas, typically >10 dB) of the architecture compared to a conventional duplexer. The improved RX-TX isolation could even allow the removal of the RX IF filters commonly used on the WCDMA RX.

It should also be noted that there are different implementation options for the architecture shown in this disclosure. The antenna switch and filters for one antenna may be placed in one module. Alternatively, both antenna switch modules SW1, SW2 can be implemented on a single chip or even integrated with the RFIC (RF integrated circuit). In principle the whole front-end could be implemented in a single module.

Figure 10:
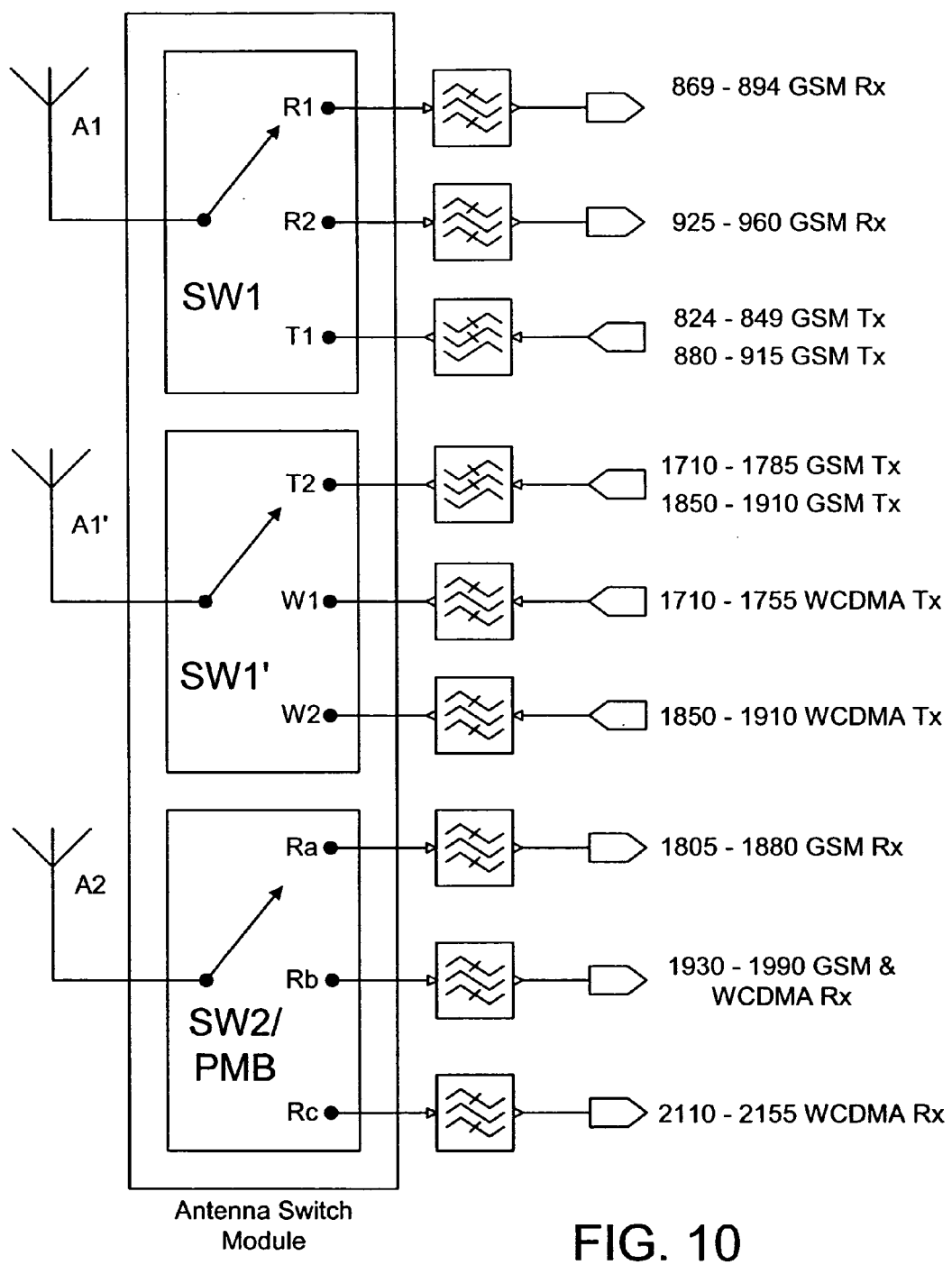
FIG. 10 is a block diagram showing a different embodiment of the antenna switch module, according to the present invention.

Moreover, instead of one main antenna A1 and one 2 GHz RX antenna A2, as shown in FIGS. 3 to 8, it is also possible to utilize two 2 GHz antennas and one 1 GHz antenna, as shown in FIG. 10. As shown in FIG. 10, A1 is a 1 GHz antenna connected to an antenna switch module SW1, which routes all 1 GHz paths through a plurality of 1 GHz filters. A1' is a 2 GHz antenna connected to an antenna switch module SW1', which routes all 2 GHz TX paths through a plurality of 2 GHz filters. A2 and SW2 remain the same as those depicted in FIGS. 3 to 8. Splitting the main antenna and the respective switch module does not alter the RF front-end architecture, according to the present invention.

Figure 1:
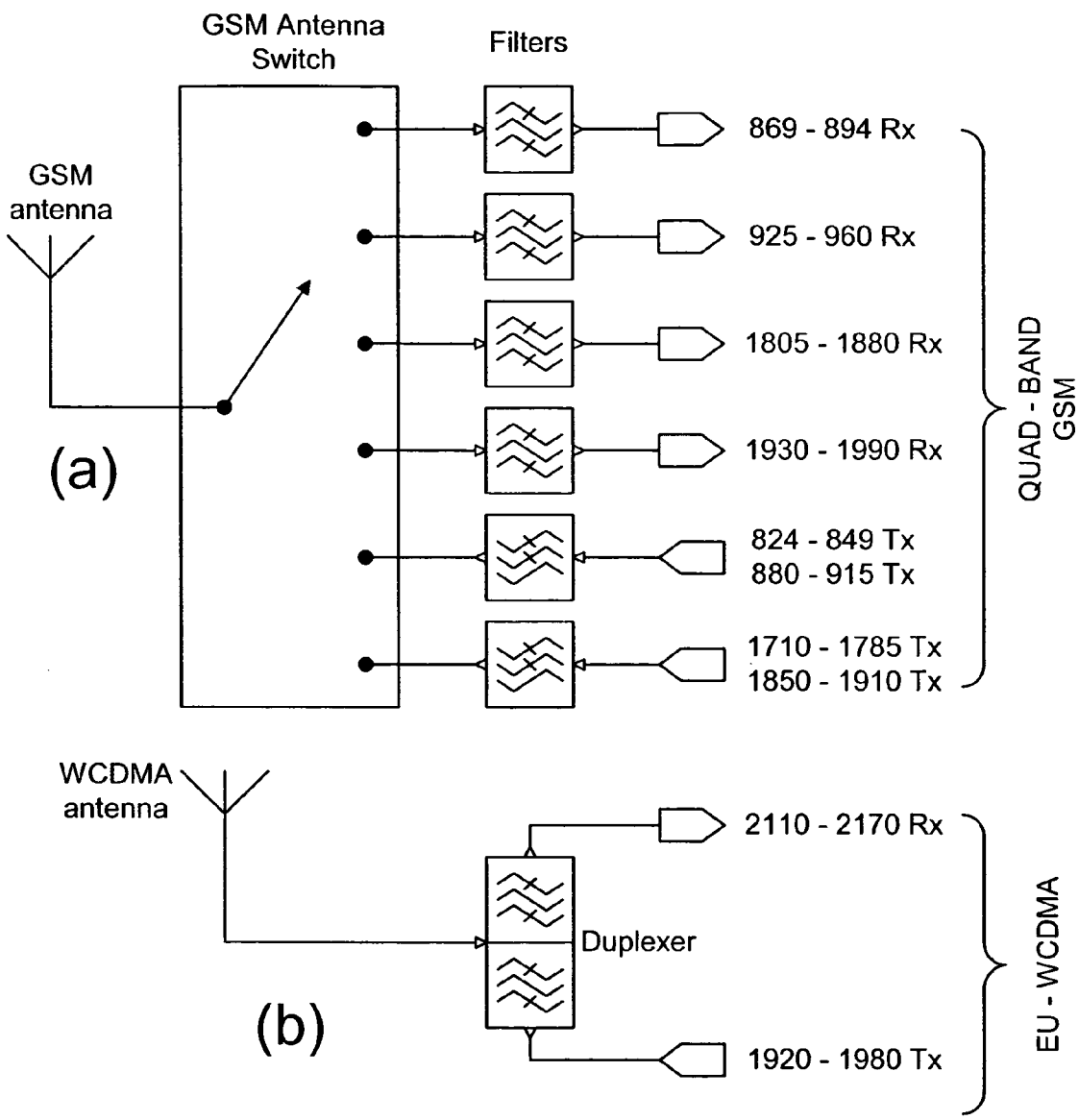
FIG. 1 is a block diagram showing a prior art EU GSM/WCDMA RF front-end module.
Figure 2:
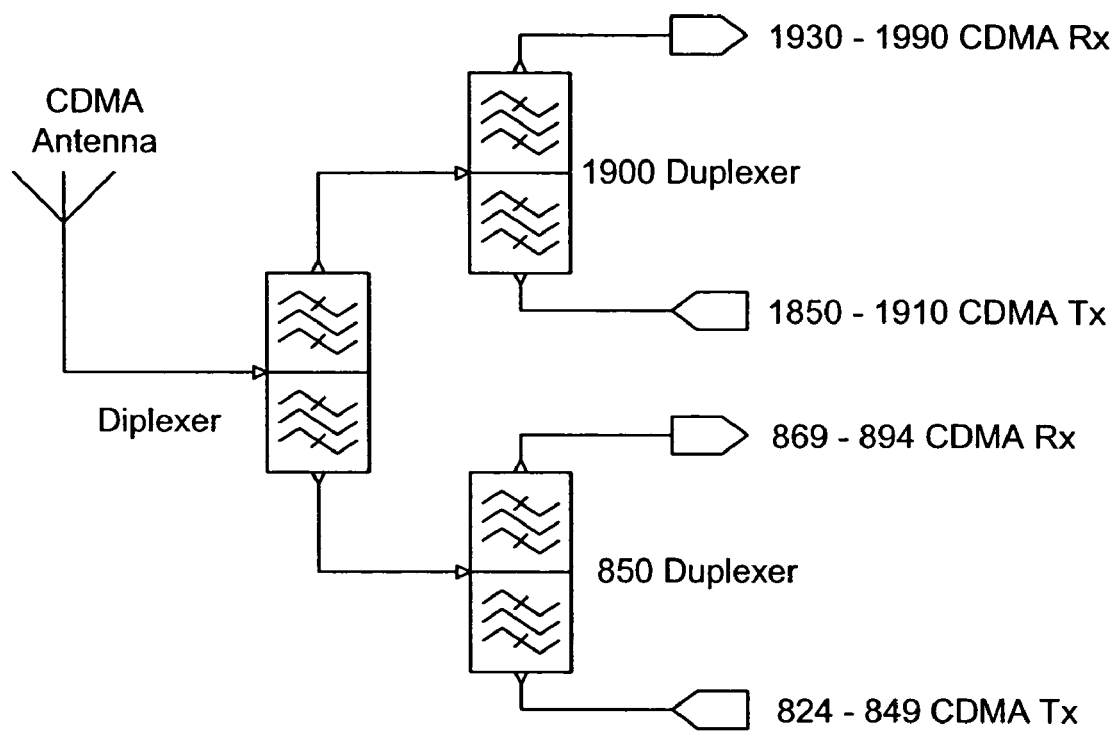
FIG. 2 is a block diagram showing a prior art US-CDMA RF front-end module.
Figure 3:
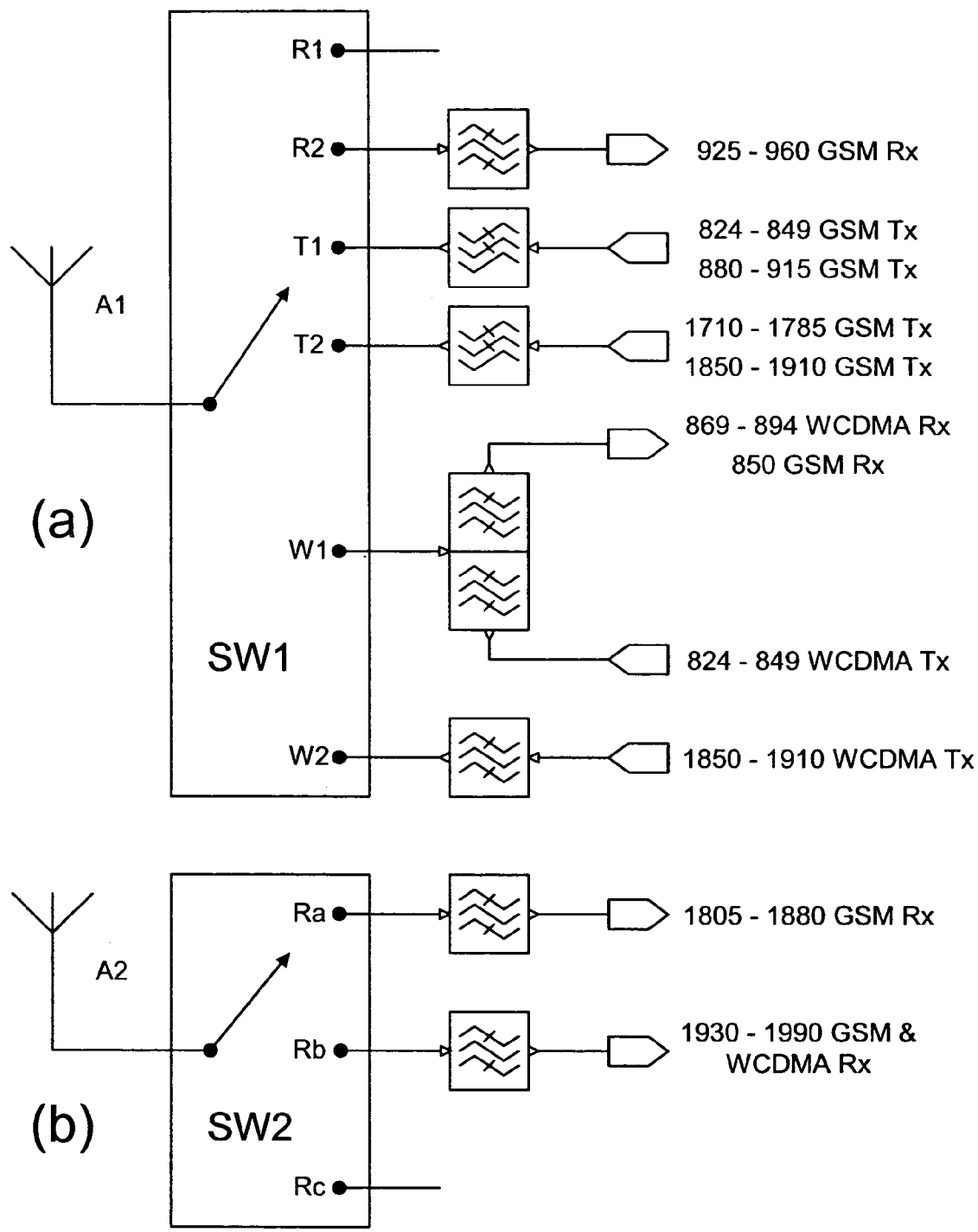
FIG. 3 is a block diagram showing a US GSM/WCDMA RF front-end module, according to the present invention.
Figure 3:
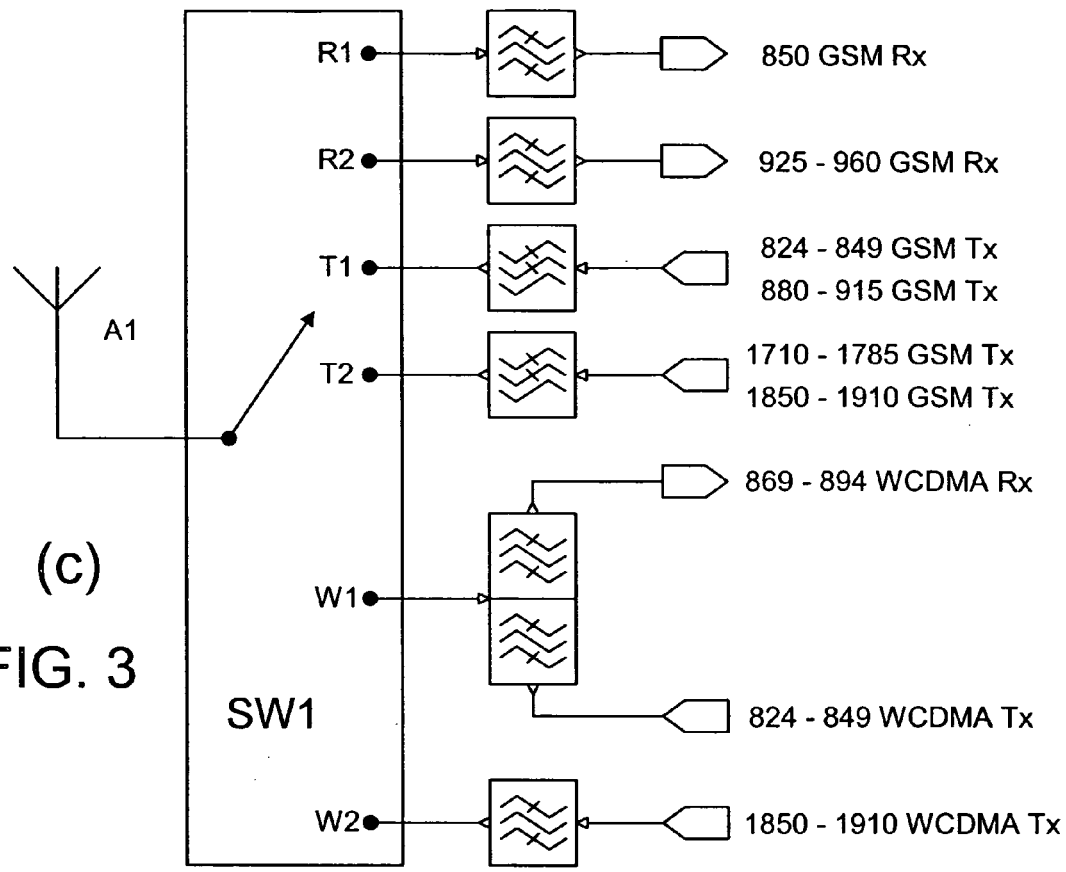
Figure 11:
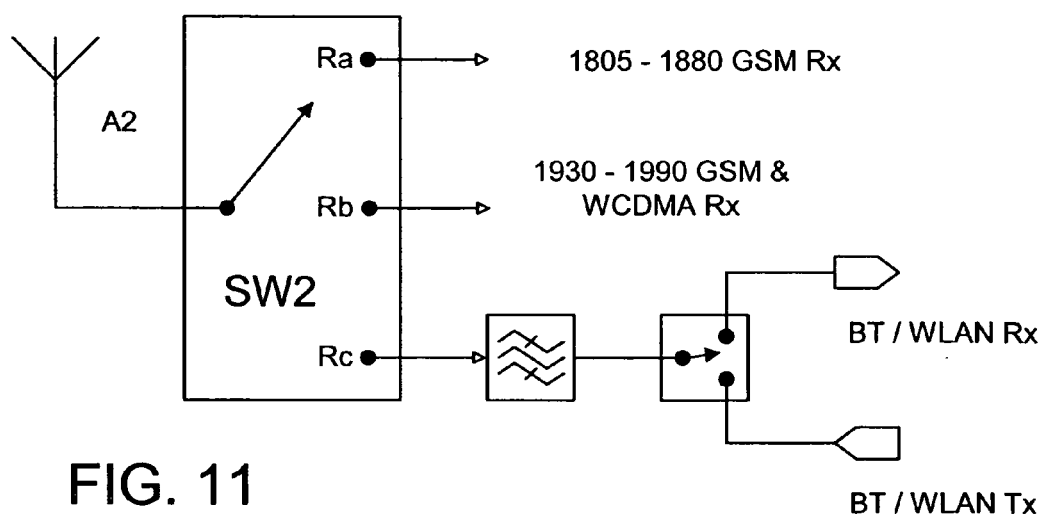
FIG. 11 is a block diagram showing an RF front-end module having a receive path and a transmit for conveying signals in the bluetooth/WLAN frequency range.
Figure 4:
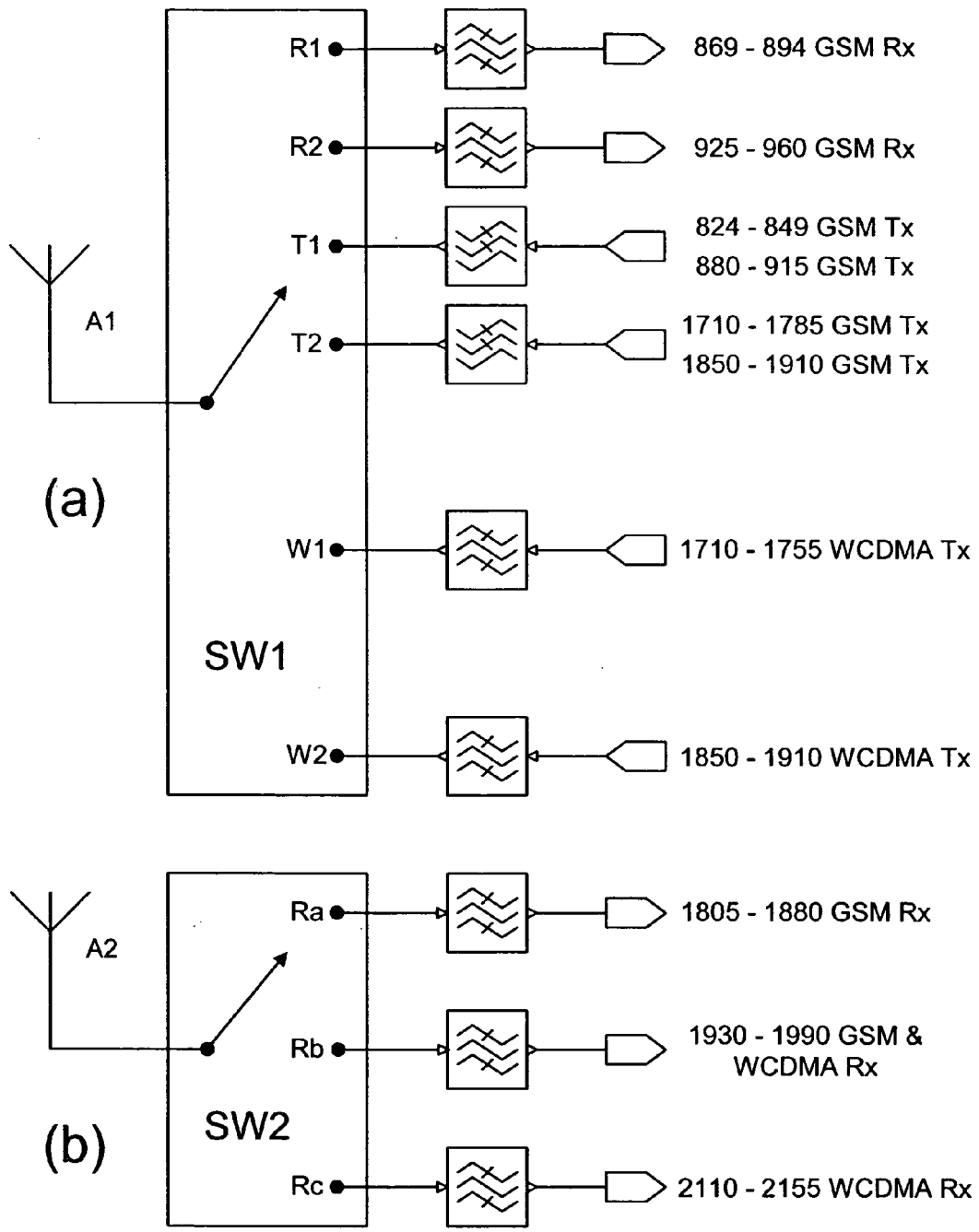
FIG. 4 is a block diagram showing another US GSM/WCDMA RF front-end module, according to the present invention.
Figure 5:
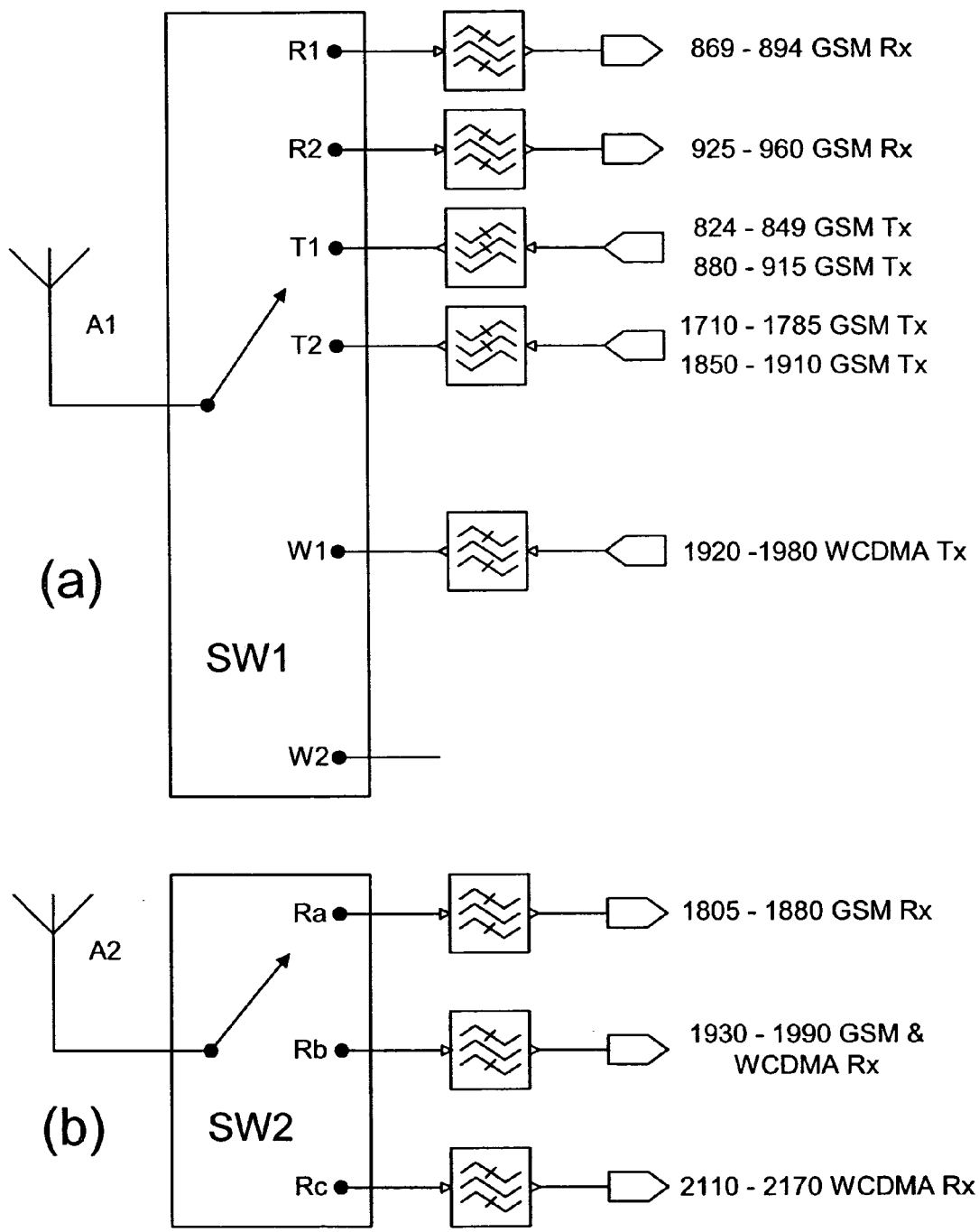
FIG. 5 is a block diagram showing an EU GSM/WCDMA RF front-end module, according to the present invention.
Figure 6:
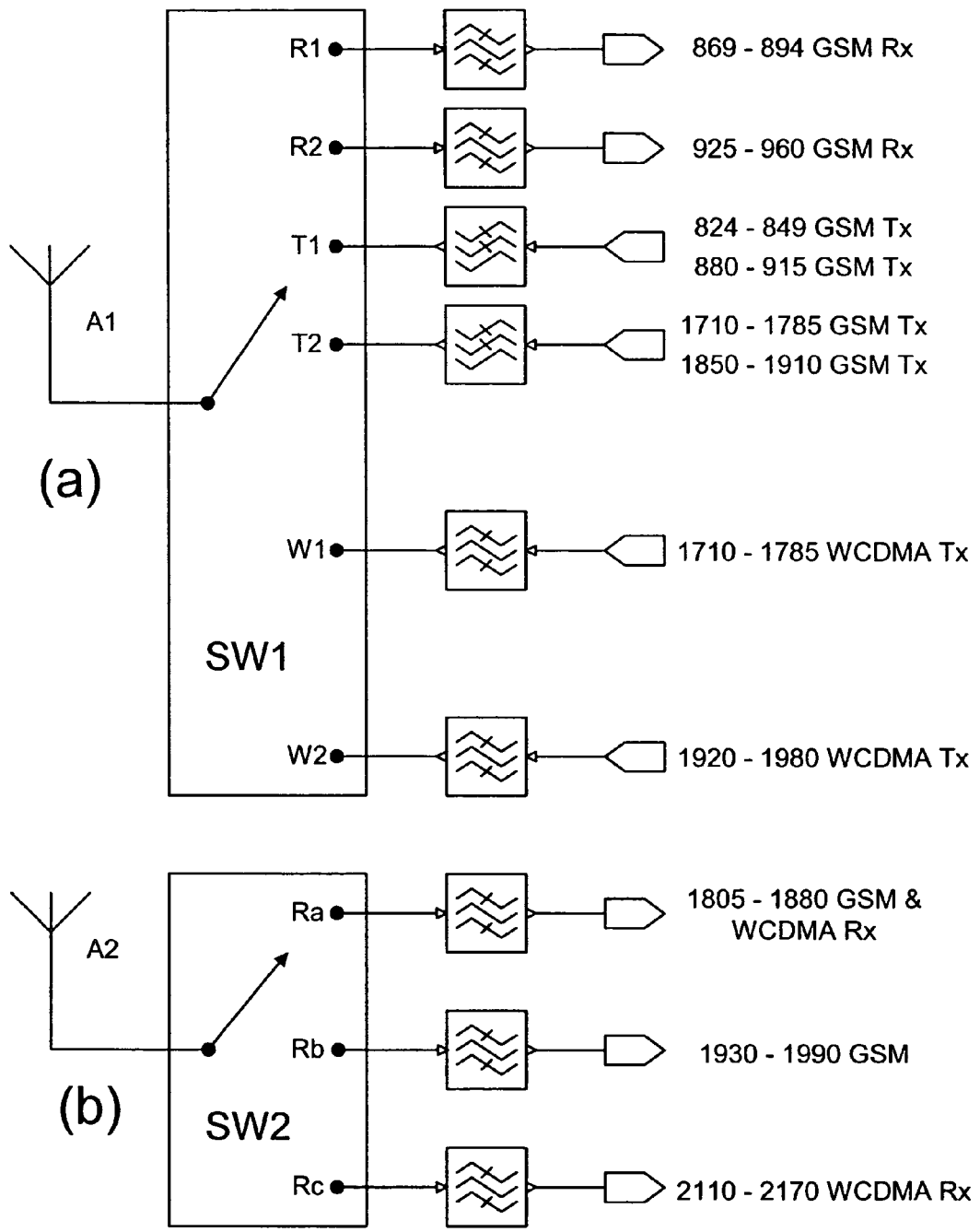
FIG. 6 is a block diagram showing another EU GSM/WCDMA RF front-end module, according to the present invention.
Figure 7:
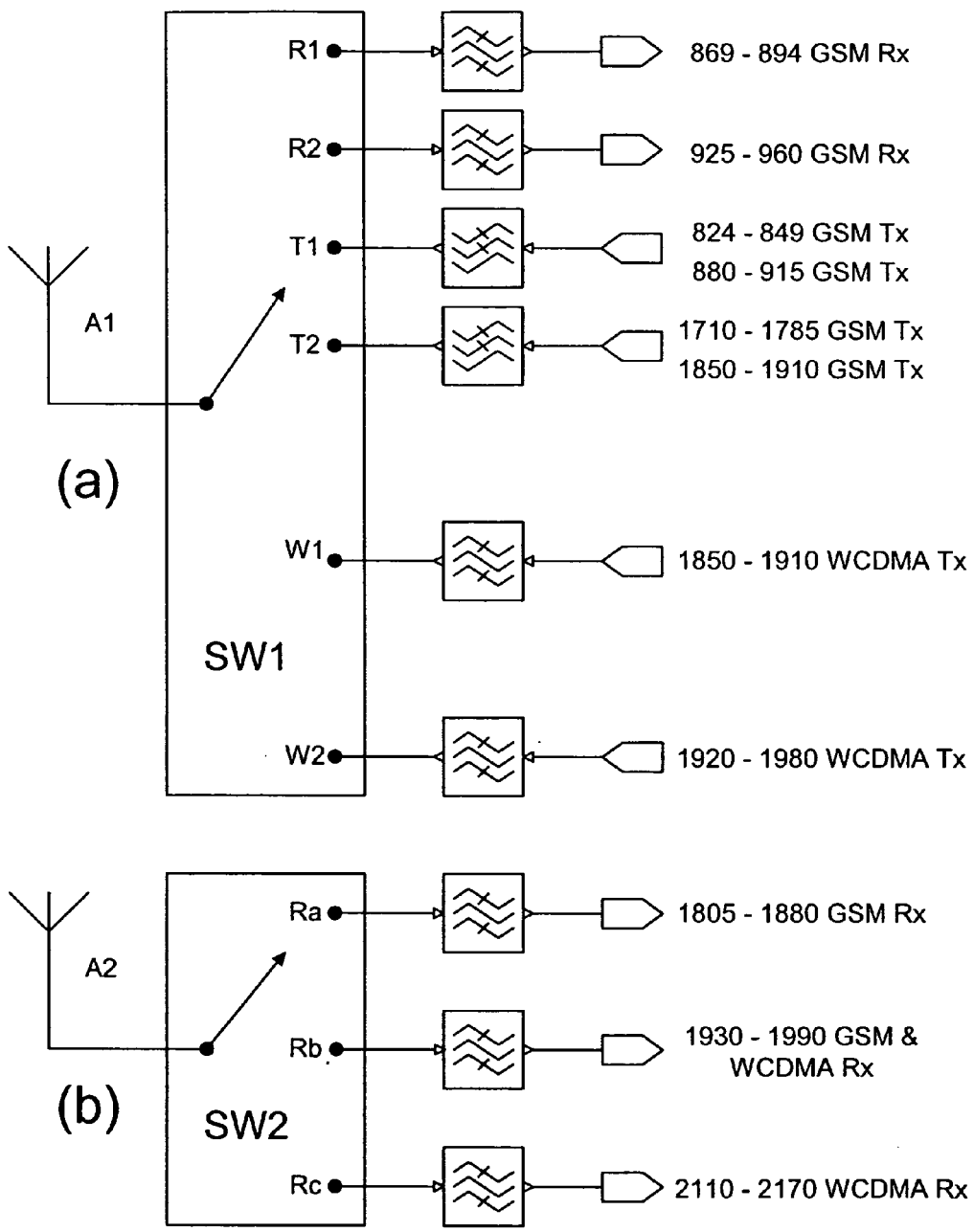
FIG. 7 is a block diagram showing an EU/US GSM/WCDMA RF front-end module, according to the present invention.

It should be noted that the versatile RF front-end, according to the present invention, can also be used for conveying transmit and receive signals in the Bluetooth/WLAN frequency range of 2.4–2.5 GHz. For example, it is possible to modify SW2 in FIG. 3b for Bluetooth/WLAN communications, while keeping the arrangement in FIG. 3a unchanged. As shown in FIG. 11, the Rc switch position is connected to a bandpass filter substantially in the frequency range of 2.4–2.5 GHz for filtering the Bluetooth/WLAN frequencies and a synchronizing switch (SP2T) for selecting the Tx and Rx paths.

It should be noted that there is virtually no difference in the RF front-end between WCDMA and CDMA signal switching if WCDMA and CDMA are operating at the same frequency. Thus, when the description refers to a WCDMA (Tx or Rx) path, the description is applicable to a respective CDMA path, and vice-versa, if the frequencies are the same.

Thus, although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for routing a plurality of RF communications signal paths in a communications device having at least a first antenna and a second antenna, wherein the signal paths comprises a plurality of receive paths and transmit paths for conveying signals in a plurality of operating modes in a first frequency range substantially between 800 MHz and 990 MHz, and a second frequency range substantially between 1600 MHz and 2500 MHz, said method comprising:
  providing a first signal path selecting part operatively connected to the first antenna;
  providing a second signal path selecting part operatively connected to the second antenna;
  operatively connecting the plurality of receive paths to the second signal path selecting part for selectively conveying receive signals in one of said plurality of receive paths in the second frequency range via the second antenna; and
  operatively connecting the plurality of transmit and receive paths to the first signal selecting part for selectively conveying signals in one of said plurality of transmit and receive paths in the first frequency range via the first antenna.

2. The method of claim 1, further comprising:
  operatively connecting the plurality of further transmit paths to the first signal selecting part for selectively conveying signals in the second frequency range via the first antenna.

3. The method of claim 1, wherein the communications device further comprising a third antenna, said method further comprising:
  providing a third path selecting part operatively connected to the third antenna; and
  operatively connecting a plurality of further transmit paths to the third signal selecting part for selectively conveying signals in the second frequency range via the third antenna.

4. The method of claim 1, wherein the first signal path selecting part comprises a plurality of switches for selecting the transmit and receive paths in the first frequency range.

5. The method of claim 2, wherein the first signal path selecting part comprises a plurality of switches for selecting the transmit and receive paths in the first frequency range and the transmit paths in the second frequency range.

6. The method of claim 3, wherein the first and third signal path selecting parts comprise a plurality of switches for selecting the transmit and receive paths in the first frequency range and the transmit path in the second frequency range.

7. The method of claim 1, wherein the second signal path selecting part comprises a plurality of switches for selecting the receive paths in the second frequency range.

8. The method of claim 1, wherein the second signal path selecting part comprises at least a balun and a matching mechanism for selecting the receive paths in the second frequency range.

9. The method of claim 1, wherein the receive paths comprise a plurality of baluns and a plurality of passband filters connected to the baluns in series, and wherein the second signal path selecting part comprises at least one matching mechanism operatively connected to the baluns for selecting the receive paths in the second frequency range.

10. The method of claim 1, wherein the second signal path selecting part comprises a plurality of phase-shifting elements for selecting the receive paths in the second frequency range.

11. The method of claim 2, wherein the communications device further comprises a third antenna, said method further comprising:
  providing a third signal path selecting part operatively connected to the third antenna;
  operatively connecting a plurality of further receive paths to the third signal path selecting part for conveying receive signals in the second frequency range via the third antenna.

12. A signal path selection part for use in a communications device, the communications device having at least a first antenna and a second antenna for conveying signals in a plurality of operating modes in a first frequency range substantially between 800 MHz and 990 MHz and a second frequency range substantially between 1600 MHz and 2500 MHz via a plurality of transmit and receive paths, said signal path selection part comprising:
  a first signal path selecting sub-part operatively connected to the first antenna; and
  a second signal path selecting sub-part operatively connected to the second antenna, wherein
  the second signal path selecting sub-part comprises a plurality of selectable positions for operatively connecting a plurality of receive paths for selectively conveying receive signals in one of said plurality of receive paths in the second frequency range via the second antenna, and
  the first signal path selecting sub-part comprises a plurality of selectable positions for operatively connecting a plurality of transmit and receive paths for selectively conveying transmit signals in one of said plurality of transmit and receive paths in the first and second frequency ranges and receive signals in the first frequency range via the first antenna.

13. The signal path selection part of claim 12, wherein the first signal path selecting sub-part comprises a plurality of switches for selecting the transmit and receive paths in the first frequency range and the transmit paths in the second frequency range.

14. The signal path selection part of claim 12, wherein the second signal path selecting sub-part comprises a plurality of switches for selecting the receive paths in the second frequency range.

15. The signal path selection part of claim 12, wherein the second signal path selecting sub-part comprises at least a balun and a matching mechanism for selecting the receive paths in the second frequency range.

16. The signal path selection part of claim 12, wherein the receive paths comprise a plurality of baluns and a plurality of passband filters connected to the baluns in series, and wherein the second signal path selecting sub-part comprises at least one matching mechanism operatively connected to the baluns for selecting the receive paths in the second frequency range.

17. The signal path selection part of claim 12, wherein the second signal path selecting sub-part comprises a plurality of phase-shifting elements for selecting the receive paths in the second frequency range.

18. The signal path selection part of claim 12, wherein the communication device further comprises a third antenna, said part further comprising:
  a third signal path selecting sub-part operatively connected to the third antenna, wherein the third signal path selecting sub-part comprises a plurality of selectable positions for operatively connecting a plurality of further receive paths for selectively conveying receive signals in the second frequency range via the third antenna.

19. A communications device operable in a plurality of operating modes in a first frequency range substantially between 800 MHz and 990 MHz and a second frequency range substantially between 1600 MHz and 2500 MHz, said communications device comprising:
  a first antenna;
  a second antenna; and
  a front-end part comprising:
    a first signal path selecting sub-part operatively connected to the first antenna; and
    a second signal path selecting sub-part operatively connected to the second antenna, wherein
    the second signal path selecting sub-part comprises a plurality of selectable positions for operatively connecting a plurality of receive paths for selectively conveying receive signals in one of said plurality of receive paths in the second frequency range via the second antenna, and
    the first signal path selecting sub-part comprises a plurality of selectable positions for operatively connecting a plurality of transmit and receive paths for selectively conveying transmit signals in one of said plurality of transmit and receive paths in the first and second frequency ranges and receive signals in the first frequency range via the first antenna.

20. The communications device of claim 19, wherein the transmit and receive paths in the first frequency range comprise:
  a receive path for conveying GSM signals substantially in a frequency range of 925 MHz to 960 MHz;
  a transmit path for conveying GSM signals substantially in a frequency range of 824 MHz to 915 MHz;
  a transmit path for conveying code-division multiple access signals substantially in a frequency range of 824 MHz to 849 MHz; and
  a receive path for conveying GSM or code-divisional multiple access signals substantially in a frequency range of 869 MHz to 894 MHz, and wherein the transmit and receive paths in the second frequency range comprise:
  a transmit path for conveying GSM signals substantially in a frequency range of 1710 MHz to 1910 MHz;
  a transmit path for conveying code-divisional multiple access signals substantially in a frequency range of 1850 MHz to 1910 MHz;
  a receive path for conveying GSM signals substantially in a frequency range of 1805 MHz to 1880 MHz; and
  a receive path for conveying GSM or code-divisional multiple access signals substantially in a frequency range of 1930 MHz to 1990 MHz.

21. The communications device of claim 19, wherein the transmit and receive paths in the first frequency range comprise:
  a receive path for conveying GSM signals substantially in a frequency range of 925 MHz to 960 MHz;
  a transmit path for conveying GSM signals substantially in a frequency range of 824 MHz to 915 MHz;
  a transmit path for conveying code-divisional multiple access signals substantially in a frequency range of 824 MHz to 849 MHz;
  a receive path for conveying GSM signals substantially in a frequency range of 869 MHz to 894 MHz; and
  a receive path for conveying code-divisional multiple access signals substantially in a frequency range of 869 MHz to 894 MHz, and wherein the transmit and receive paths in the second frequency range comprise:
  a transmit path for conveying GSM signals substantially in a frequency range of 1710 MHz to 1910 MHz;
  a transmit path for conveying code-divisional multiple access signals substantially in a frequency range of 1850 MHz to 1910 MHz;
  a receive path for conveying GSM signals substantially in a frequency range of 1805 MHz to 1880 MHz; and
  a receive path for conveying GSM or code-divisional multiple access signals substantially in a frequency range of 1930 MHz to 1990 MHz.

22. The communications device of claim 19, wherein the transmit and receive paths in the first frequency range comprise:
  a receive path for conveying GSM signals substantially in a frequency range of 925 MHz to 960 MHz;
  a transmit path for conveying GSM signals substantially in a frequency range of 824 MHz to 915 MHz; and
  a receive path for conveying GSM signals substantially in a frequency range of 869 MHz to 894 MHz, and wherein the transmit and receive paths in the second frequency range comprise:
  a transmit path for conveying GSM signals substantially in a frequency range of 1710 MHz to 1910 MHz;
  a transmit path for conveying code-divisional multiple access signals substantially in a frequency range of 1850 MHz to 1910 MHz;
  a receive path for conveying GSM signals substantially in a frequency range of 1805 MHz to 1880 MHz;
  a receive path for conveying GSM or code-divisional multiple access signals substantially in a frequency range of 1930 MHz to 1990 MHz;
  a transmit path for conveying code-divisional multiple access signals substantially in a frequency range of 1710 MHz to 1755 MHz, and
  a receive path for conveying code-divisional multiple access signals substantially in a frequency range of 2110 MHz to 2155 MHz.

23. The communications device of claim 19, wherein the transmit and receive paths in the first frequency range comprise:
  a receive path for conveying GSM signals substantially in a frequency range of 925 MHz to 960 MHz;

a transmit path for conveying GSM signals substantially in a frequency range of 824 MHz to 915 MHz; and a receive path for conveying GSM signals substantially in a frequency range of 869 MHz to 894 MHz, and wherein the transmit and receive paths in the second frequency range comprise:

a transmit path for conveying GSM signals substantially in a frequency range of 1710 MHz to 1910 MHz;

a receive path for conveying GSM signals substantially in a frequency range of 1805 MHz to 1880 MHz;

a receive path for conveying GSM or code-divisional multiple access signals substantially in a frequency range of 1930 MHz to 1990 MHz;

a transmit path for conveying code-divisional multiple access signals substantially in a frequency range of 1920 MHz to 1980 MHz, and a receive path for conveying code-divisional multiple access signals substantially in a frequency range of 2110 MHz to 2170 MHz.

24. The communications device of claim 19, wherein the transmit and receive paths in the first frequency range comprise:

a receive path for conveying GSM signals substantially in a frequency range of 925 MHz to 960 MHz;

a transmit path for conveying GSM signals substantially in a frequency range of 824 MHz to 915 MHz; and a receive path for conveying GSM signals substantially in a frequency range of 869 MHz to 894 MHz, and wherein the transmit and receive paths in the second frequency range comprise:

a transmit path for conveying GSM signals substantially in a frequency range of 1710 MHz to 1910 MHz;

a receive path for conveying GSM and code-divisional multiple access signals substantially in a frequency range of 1805 MHz to 1880 MHz;

a receive path for conveying GSM signals substantially in a frequency range of 1930 MHz to 1990 MHz;

a transmit path for conveying code-divisional multiple access signals substantially in a frequency range of 1710 MHz to 1755 MHz;

a transmit path for conveying code-divisional multiple access signals substantially in a frequency range of 1920 MHz to 1980 MHz; and a receive path for conveying code-divisional multiple access signals substantially in a frequency range of 2110 MHz to 2170 MHz.

25. The communications device of claim 19, wherein the transmit and receive paths in the first frequency range comprise:

a receive path for conveying GSM signals substantially in a frequency range of 925 MHz to 960 MHz;

a transmit path for conveying GSM signals substantially in a frequency range of 824 MHz to 915 MHz; and a receive path for conveying GSM signals substantially in a frequency range of 869 MHz to 894 MHz, and wherein the transmit and receive paths in the second frequency range comprise:

a transmit path for conveying GSM signals substantially in a frequency range of 1710 MHz to 1910 MHz;

a transmit path for conveying code-divisional multiple access signals substantially in a frequency range of 1850 MHz to 1910 MHz;

a receive path for conveying GSM signals substantially in a frequency range of 1805 MHz to 1880 MHz;

a receive path for conveying code-divisional multiple access signals substantially in a frequency range of 1920 MHz to 1980 MHz;

a receive path for conveying code-divisional multiple access signals substantially in a frequency range of 2110 MHz to 2170 MHz; and a receive path for conveying GSM or code-divisional multiple access signals substantially in a frequency range of 1930 MHz to 1990 MHz.

26. The communications device of claim 19, further comprising a third antenna, and the front-end part further comprises:

a third signal path selecting sub-part operatively connected to the third antenna, the third signal path selecting sub-part comprising a plurality of selectable positions for operatively connecting a plurality of further receive paths for selectively conveying receive signals in the second frequency range via the third antenna.

27. The communications device of claim 19 comprises a mobile terminal.

28. The communications device of claim 19, wherein at least one of said plurality of receive paths for receiving signals in the second frequency range via the second antenna is used for receiving signals in a frequency range substantially between 2.4–2.5 GHz.

29. The communications device of claim 28, further comprising a transmit path for transmitting signals in a frequency range substantially between 2.4–2.5 GHz via the second antenna and a sub-switch for selecting between said transmit path and said at least one receive path for receiving signals in the 2.4–2.5 GHz.

30. The communications device of claim 29, wherein said transmit and receive signals in the 2.4–2.5 GHz frequency range are Bluetooth or WLAN signals.

31. An RF-front-end part for use in a communications device operable in a plurality of operating modes in a first frequency range substantially between 800 MHz and 990 MHz and a second frequency range substantially between 1600 MHz and 2500 MHz, the communications devices comprising a first antenna and a second antenna, said front-end part comprising:

a first signal path selecting sub-part operatively connected to the first antenna;

a second signal path selecting sub-part operatively connected to the second antenna;

a plurality of receive paths operatively connected to the second signal path selecting sub-part for selectively conveying signals in one of said plurality of receive paths in the second frequency range through a plurality of filters operable in the second frequency range;

a plurality of transmit paths operatively connected to the first signal path selecting sub-part for selectively conveying signals in one of said plurality of transmit and receive paths in the second frequency range through a plurality of filter operable in the second frequency range; and a plurality of transmit and receive paths operatively connected to the first signal path selecting sub-part for selectively conveying signals in the first frequency range through a plurality of filters operable in the first frequency range.

32. The front-end part of claim 31, wherein the transmit and receive paths in the first frequency range comprise:

a receive path for conveying GSM signals substantially in a frequency range of 925 MHz to 960 MHz;

a transmit path for conveying GSM signals substantially in a frequency range of 824 MHz to 915 MHz;

a transmit path for conveying code-divisional multiple access signals substantially in a frequency range of 824 MHz to 849 MHz; and a receive path for conveying GSM or code-divisional multiple access signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a transmit path for conveying code-divisional multiple access signals substantially in a frequency range of 1850 MHz to 1910 MHz;
a receive path for conveying GSM signals substantially in a frequency range of 1805 MHz to 1880 MHz; and
a receive path for conveying GSM or code-divisional multiple access signals substantially in a frequency range of 1930 MHz to 1990 MHz.

33. The front end part of claim 31, wherein the transmit and receive paths in the first frequency range comprise:
a receive path for conveying GSM signals substantially in a frequency range of 925 MHz to 960 MHz;
a transmit path for conveying GSM signals substantially in a frequency range of 824 MHz to 915 MHz;
a transmit path for conveying code-divisional multiple access signals substantially in a frequency range of 824 MHz to 849 MHz;
a receive path for conveying GSM signals substantially in a frequency range of 869 MHz to 894 MHz; and
a receive path for conveying code-divisional multiple access signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a transmit path for conveying code-divisional multiple access signals substantially in a frequency range of 1850 MHz to 1910 MHz;
a receive path for conveying GSM signals substantially in a frequency range of 1805 MHz to 1880 MHz; and
a receive path for conveying GSM or code-divisional multiple access signals substantially in a frequency range of 1930 MHz to 1990 MHz.

34. The front end part of claim 31, wherein the transmit and receive paths in the first frequency range comprise:
a receive path for conveying GSM signals substantially in a frequency range of 925 MHz to 960 MHz;
a transmit path for conveying GSM signals substantially in a frequency range of 824 MHz to 915 MHz; and
a receive path for conveying GSM signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a transmit path for conveying code-divisional multiple access signals substantially in a frequency range of 1850 MHz to 1910 MHz;
a receive path for conveying GSM signals substantially in a frequency range of 1805 MHz to 1880 MHz;
a receive path for conveying GSM or code-divisional multiple access signals substantially in a frequency range of 1930 MHz to 1990 MHz;
a transmit path for conveying code-divisional multiple access signals substantially in a frequency range of 1710 MHz to 1755 MHz, and
a receive path for conveying code-divisional multiple access signals substantially in a frequency range of 2110 MHz to 2155 MHz.

35. The front end part of claim 31, wherein the transmit and receive paths in the first frequency range comprise:
a receive path for conveying GSM signals substantially in a frequency range of 925 MHz to 960 MHz;
a transmit path for conveying GSM signals substantially in a frequency range of 824 MHz to 915 MHz; and
a receive path for conveying GSM signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a receive path for conveying GSM signals substantially in a frequency range of 1805 MHz to 1880 MHz;
a receive path for conveying GSM or code-divisional multiple access signals substantially in a frequency range of 1930 MHz to 1990 MHz;
a transmit path for conveying code-divisional multiple access signals substantially in a frequency range of 1920 MHz to 1980 MHz, and
a receive path for conveying code-divisional multiple access signals substantially in a frequency range of 2110 MHz to 2170 MHz.

36. The front end part of claim 31, wherein the transmit and receive paths in the first frequency range comprise:
a receive path for conveying GSM signals substantially in a frequency range of 925 MHz to 960 MHz;
a transmit path for conveying GSM signals substantially in a frequency range of 824 MHz to 915 MHz; and
a receive path for conveying GSM signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a receive path for conveying GSM and code-divisional multiple access signals substantially in a frequency range of 1805 MHz to 1880 MHz;
a receive path for conveying GSM signals substantially in a frequency range of 1930 MHz to 1990 MHz;
a transmit path for conveying code-divisional multiple access signals substantially in a frequency range of 1710 MHz to 1755 MHz;
a transmit path for conveying code-divisional multiple access signals substantially in a frequency range of 1920 MHz to 1980 MHz; and
a receive path for conveying code-divisional multiple access signals substantially in a frequency range of 2110 MHz to 2170 MHz.

37. The front end part of claim 31, wherein the transmit and receive paths in the first frequency range comprise:
a receive path for conveying GSM signals substantially in a frequency range of 925 MHz to 960 MHz;
a transmit path for conveying GSM signals substantially in a frequency range of 824 MHz to 915 MHz; and
a receive path for conveying GSM signals substantially in a frequency range of 869 MHz to 894 MHz, and wherein the transmit and receive paths in the second frequency range comprise:
a transmit path for conveying GSM signals substantially in a frequency range of 1710 MHz to 1910 MHz;
a transmit path for conveying code-divisional multiple access signals substantially in a frequency range of 1850 MHz to 1910 MHz;
a receive path for conveying GSM signals substantially in a frequency range of 1805 MHz to 1880 MHz;

a transmit path for conveying code-divisional multiple access signals substantially in a frequency range of 1920 MHz to 1980 MHz;

a receive path for conveying code-divisional multiple access signals substantially in a frequency range of 2110 MHz to 2170 MHz; and a receive path for conveying GSM or code-divisional multiple access signals substantially in a frequency range of 1930 MHz to 1990 MHz.

38. The front end part of claim 31, wherein the communications device further comprises a third antenna, said front-end part further comprising:

a third signal path selecting sub-part operatively connected to the third antenna, the third signal path selecting sub-part comprising a plurality of selectable positions for operatively connecting a plurality of further receive paths for selectively conveying receive signals in the second frequency range via the third antenna.

39. The front-end part of claim 31, wherein at least one of said plurality of receive paths for receiving signals in the second frequency range via the second antenna is used for receiving signals in a frequency range substantially between 2.4–2.5 GHz.

40. The front end part of claim 39, further comprising a transmit path for transmitting signals in a frequency range substantially between 2.4–2.5 GHz via the second antenna and a sub-switch for selecting between said transmit path and said at least one receive path for receiving signals in the 2.4–2.5 GHz.

41. The front end part of claim 40, wherein said transmit and receive signals in the 2.4–2.5 GHz frequency range are Bluetooth or WLAN signals.

42. A signal path selection part for use in a communications device, the communications device having at least a first antenna and a second antenna for conveying signals in a plurality of operating modes in a first frequency range substantially between 800 MHz and 990 MHz and a second frequency range substantially between 1600 MHz and 2500 MHz via a plurality of transmit and receive paths, said signal path selection part comprising:

a first means operatively connecting a plurality of transmit and receive paths to a first antenna for selectively conveying transmit signals in one of said plurality of transmit and receive paths in the first and second frequency ranges and receive signals in the first frequency range via the first antenna; and a second means operatively connecting a plurality of receive paths to a second antenna for selectively conveying receive signals in one of said plurality of receive paths in the second frequency range via the second antenna.

43. The signal path selection part of claim 42, wherein the first means comprises a plurality of switching means for selecting the transmit and receive paths in the first frequency range and the transmit paths in the second frequency range.

* * * * *